United States Patent [19]

Hamblin

[11] Patent Number: 5,736,862
[45] Date of Patent: Apr. 7, 1998

[54] SYSTEM FOR DETECTING FAULTS IN CONNECTIONS BETWEEN INTEGRATED CIRCUITS AND CIRCUIT BOARD TRACES

[75] Inventor: Michael W. Hamblin, Stow, Mass.

[73] Assignee: Genrad, Inc., Westford, Mass.

[21] Appl. No.: 493,399

[22] Filed: Jun. 22, 1995

[51] Int. Cl.[6] ............................................. G01R 31/04
[52] U.S. Cl. ..................................... 324/527; 324/537
[58] Field of Search .............................. 324/520, 527, 324/537, 538, 765

[56] References Cited

U.S. PATENT DOCUMENTS

| | | | |
|---|---|---|---|
| 4,220,917 | 9/1980 | McMahon, Jr. ........................ | 324/537 |
| 4,841,240 | 6/1989 | Hsue et al. ............................ | 324/537 |
| 5,072,175 | 12/1991 | Marek .................................. | 324/158 R |
| 5,399,975 | 3/1995 | Laing et al. ........................... | 324/537 |
| 5,469,064 | 11/1995 | Kerschner et al. ................... | 324/537 |
| 5,486,753 | 1/1996 | Khazam et al. ...................... | 324/537 X |
| 5,521,513 | 5/1996 | Stringer .............................. | 324/537 |

FOREIGN PATENT DOCUMENTS 0 094 486 A1  4/1982  European Pat. Off. ........ G01R 27/02
0 575 061 A1  12/1993  European Pat. Off. ........ G01R 31/04

OTHER PUBLICATIONS

"Latent Open Testing of Electronic Packaging" Arnold Halpern, Thomas H. DeStefano and Shinwu Chiang, pp. 83–88, 0-8186-5560-7/94 Jul. 1994 IEEE.

Primary Examiner—Glenn W. Brown
Attorney, Agent, or Firm—Cesari and McKenna, LLP

[57] ABSTRACT

A system for detecting open circuits in connections between pins of an integrated circuit (IC) and traces on a circuit board on which the IC is mounted makes use of a-c paths inherent in the IC. An input signal is applied to a trace to which a pin of the IC is nominally connected. An internal a-c path in the IC carries the signal to another pin. Failure to detect an output signal derived from the input signal, above predetermined thresholds, at the trace to which the latter pin is nominally connected indicates failure of a pin-to-trace connection.

11 Claims, 2 Drawing Sheets

SYSTEM FOR DETECTING FAULTS IN CONNECTIONS BETWEEN INTEGRATED CIRCUITS AND CIRCUIT BOARD TRACES

BACKGROUND OF THE INVENTION

A. Field of the Invention

The present invention concerns the testing of electronic-circuit boards and, in particular, the detection of open circuits between integrated circuits (IC's) and the board traces to which they should be connected.

Testing for proper functioning of electronic-circuit boards has now been performed automatically for decades, and for most of that time various test techniques have been used to detect open circuits between component pins and the board tracks to which they should be soldered or otherwise electrically connected. For much of the history of board testing, however, such open circuits have been a relatively minor concern. They occurred relatively infrequently, so manual probing to diagnose them was acceptable in most situations.

We refer here to "manual" probing because most high-volume tests are performed in a more-automatic manner. Typically, the board is placed in a "bed of nails" fixture, in which a large number of spring probes, or "nails," simultaneously contact respective nodes on the bottom of the board to be tested, and a user does not have to position those probes manually. Various automatic switching mechanisms in an automatic circuit tester then connect the nails to various driving and sensing circuitry, causing stimuli to be applied to the board and its responses to be recorded.

In the past, this approach was not typically used to detect open pins because the nails typically contact the "bottom," or non-component side, of the usual, "one-sided" circuit board, while the most-straightforward way of testing for the proper pin connection involves placing a probe on the component pin, which is on the other side of the board, to determine whether a signal applied to the board track appears on the pin.

But open pins have recently become a problem of greater significance. The reason for this largely is that pin pitches have become increasingly fine, and this has made it harder to register the pin accurately with its proper location on the board. Tester manufacturers therefore began to put some effort recently into providing more-automatic means of testing for open component pins. Obviously, the best approach would be one that can be performed through the bed of nails exclusively, without the additional fixturing complexity that affording physical access to the board's component side necessitates. Automatic-type access to the component side of the board typically necessitates the use of so-called clamshell fixtures, which employ two arrays of probes, one for each face of the circuit board. Such an arrangement exacts penalties in fixture cost and throughput, and it is a large part of the reason why manufacturers have traditionally favored one-sided boards: they could be tested without clamshell fixtures.

Efforts at developing open-pin tests therefore initially concentrated on approaches that required only a single, bed-of-nails probe array, and some approaches have been developed that can detect open pins in a wide range of situations without resorting to clamshell fixtures. But there are certain limited test situations that thus far have not proved amenable to one-sided open-circuit testing. These are usually situations in which the tester's instrument complement is rather limited and/or the board employs components, such as custom ASICs, for which adequate diagnostic information is not available. Because an early solution to the problem of finding one-sided tests for open circuits in these situations began to appear unlikely, tester manufacturers eventually concluded that they needed to provide tests that resort to clamshell fixtures.

Probing considerations on the component side of the board differ from those that prevail on the non-component side. As a probe target, for instance, a component pin is much more fragile and sometimes more difficult to hit. Moreover, it is virtually impossible to make actual contact with a pin of a surface-mount-technology (ST) component. So component-side probes proposed for high-volume open-circuit tests have usually been of the non-contact type and typically capacitive.

In a typical test that employs a capacitive probe, the stimulus signal is applied (typically from the non-component side) to a trace to which the component pin in question should be connected. Of course, the pin is mounted in a component package that houses an integrated circuit, and the internal connection between the pin and the integrated circuit is often provided by a lead frame. The lead frame provides a conductive surface that can capacitively couple the pin signal to a capacitive probe in the form of a conductive plate placed adjacent to the component package's upper surface.

Now, to determine whether the connection is made properly, the capacitive open-circuit-testing technique essentially measures the series capacitance in the path from the board track through the pin and the lead frame to the capacitive probe. If there is a connection between the track and the pin, that capacitance consists essentially of the capacitance between the capacitive probe and the lead-frame leg connected to the pin being tested. But an improper connection interposes a further, much smaller capacitance between the component pin and the track to which it should be connected. This results in a very low series capacitance and thus a very high impedance, which greatly attenuates the signal coupled from the path to the probe. This absence of a significant signal can therefore be taken as an indication of an open pin.

As noted above, the various capacitive sensing arrangements require the use of a test fixture that provides access to both the top and the bottom of the circuit board. On the other hand, for all tests other than tests for pin-to-circuit board continuity, access to only the bottom of the circuit board, through a conventional bed of nails fixture, suffices to make the necessary connections. Thus, the use of capacitive open-circuit testing requires a substantially more expensive fixture. Since the fixtures are tailored to the circuit boards to be tested, a different fixture must be used for each circuit board and the additional cost for the fixtures that can access the tops of the boards is a major factor, particularly for those firms that manufacture a relatively large number of different circuit boards.

Moreover, recently an increasing number of integrated circuit (IC) chips are fabricated with internal ground planes. These ground planes effectively shield the internal leads and therefore make it impossible to obtain capacitive coupling to these leads for open-circuit detection. Additionally it is now proposed to mount IC chips directly to the circuit boards, i.e. without the use of lead frames in the IC packages. This "chip-on-board" arrangement largely eliminates the required capacitive coupling between the leads and an overlying capacitive probe, again rendering ineffective the use of a capacitive probe in the detection of open circuits.

Another approach that has been proposed makes use of the fact that most pins of IC's are connected to diodes in the IC's. These diodes may be, for example, over-voltage protection diodes, junctions of bi-polar transistors, source-to-substrate junctions and the like. A pair of pins is selected in which there is an internal DC path between the IC diodes connected to those pins. A varying bias is applied to the trace nominally connected to one of the pins and variations in the current at the trace connected to the other pin are observed. If the variations exceed a threshold level, both pins are assumed to be connected to the respective traces. Unfortunately, most pins of IC's are usually connected to pins of other IC's on the same circuit board. The foregoing test results in currents in those other pins and this markedly reduces the reliability of the tests.

Accordingly, it is an object of the invention to provide an improved system for detection of open circuits in the connections between integrated circuits and the traces on the circuit boards to which they are mounted.

A more specific object is to provide an open-circuit detection system which can be used with a test fixture that accesses the circuit boards from only one side.

Another object of the invention is to provide an open-circuit detection system that is effective with chips containing internal ground planes.

A further object of the invention is to provide an open circuit detection system that is effective with integrated circuit packages that do not contain lead frames.

DESCRIPTION OF THE INVENTION

A. BRIEF SUMMARY OF THE INVENTION

The invention makes use of internal a-c paths between pairs of pins of an IC. These paths include not only the DC paths but also other paths, for example, paths involving capacitive coupling. Thus, if an a-c signal is applied to a circuit board trace to which a pin of the subject IC should be connected and an output signal of the same frequency and above a threshold level, appears at a trace that is nominally connected to a second pin, one can infer that both pins are connected to the respective traces.

A similar approach makes use of the fact that a diode biased into the nonlinear portion of its characteristic can operate as a mixer and thus generate sum and difference frequencies when two input signals of different frequency are applied to it. Accordingly, if two input signals of different frequency are applied to circuit board traces to which pins of the subject IC should be connected and an output signal at the difference frequency, for example, and above a threshold level, appears on a trace to which a third pin should be connected, one can infer that all three pins are connected to the respective traces.

Actually the traces to which the signals are applied and from which they are extracted are often connected to other IC's on the same circuit board as noted above, and the a-c paths in the latter IC's may also result in output signals. For this reason we prefer to select the pins on the IC under test such that not all of them are connected to circuit board traces that are common to another device on the same circuit board.

Moreover, in setting up a test procedure for the connections of an IC to the circuit board, we undertake a "learn mode" procedure in which a first set of readings is made on an IC that is known to be properly connected to the circuit board and a second set of readings involving both pins on the subject IC and pins on other IC's on the same board. The second set of readings elicits response signals from the other IC's on the board and those signals are used in selecting pin combinations for tests and also in setting thresholds for the tests. Specifically the thresholds for the various output signals are set between the learn-mode readings obtained using only pins on the subject IC and those obtained involving pins on other IC's. During the subsequent test routines, signal strengths above the thresholds indicate proper connections of the pins to the circuit board traces, and, conversely, levels below the thresholds indicate failed connections.

I have found that the output voltage is decreased substantially when there are open circuits between the pins involved in a test and the circuit board traces to which they are nominally connected, even with the alternate current paths provided by other IC's on the same circuit board. This provides a high degree of reliability in the test results, which distinguishes it from the prior proposed use of DC current paths.

B. BRIEF DESCRIPTION OF THE DRAWINGS

For a fuller understanding of the nature of the invention, reference should be had to the following detailed description taken in connection with the accompanying drawings, in which.

C. DETAILED DESCRIPTION OF THE INVENTION

Figure 1:
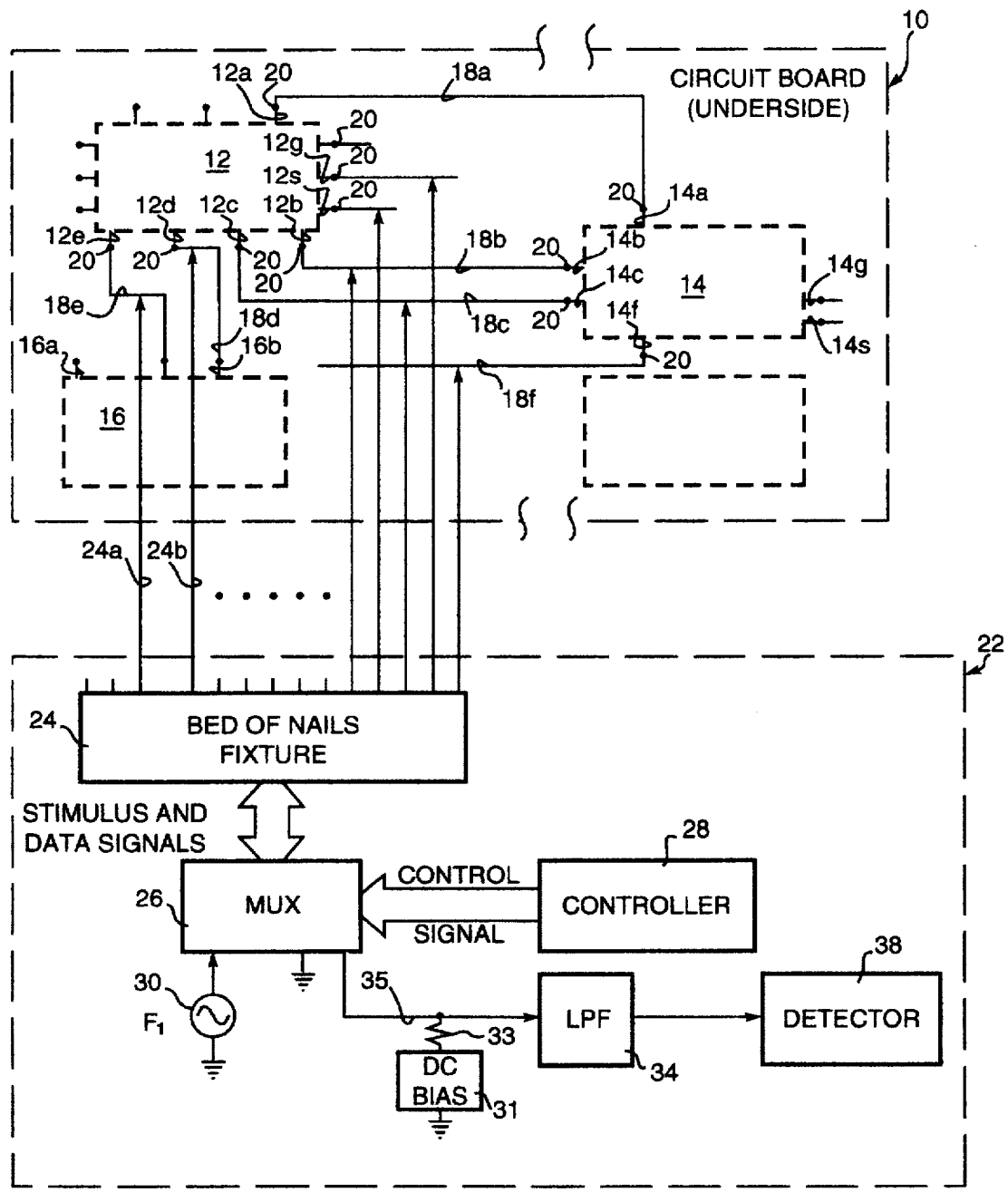
FIG. 1 is a schematic diagram of a circuit board and a tester that tests the board in accordance with one embodiment of the invention.

FIG. 1 depicts a circuit board 10, a portion of which is shown in the drawing. A plurality of IC's, such as those indicated at 12, 14 and 16, are mounted on the circuit board and these IC's are connected to each other and to other components and/or connectors (not shown) by circuit board traces such as those indicated at $18_a$.... More specifically the IC's have electrodes, shown as pins 18 at nodes 20.

The circuit board 10 is mounted on a circuit board tester, generally indicated at 22, which performs various tests on the circuit board and the components mounted thereon. The tester 22 includes a bed-of-nails fixture 24 on which the board is directly mounted and which includes contacts $24_a$... that contact various traces 18 on the board 10. The fixture 24 in turn is connected to various voltage sources and detectors in the tester 22 by way of a multiplexer 26. The multiplexer 26, which may take the form of a conventional switching matrix provides for selectable connections of the various sources and detectors by means of software (not shown) that operates a controller 28.

The tester 22 can perform a number of different tests on the board 10 and included within those tests are those to which the invention is directed, specifically the detection of open circuits between the electrodes of the IC's and the circuit board traces to which the electrodes are nominally connected.

The pins to which the input signals are applied are sometimes referred to herein as "input pins" and, similarly, the pins from which-the output signals are extracted are referred to as "output pins".

The tester 22 includes among its sources a signal source 30 that generates an a-c input signal at a frequency $f_1$. The tester also includes a low-pass filter 34, which receives output signals from the fixture 24 by way of the multiplexer 26 and passes the filtered signals to a detector 38. A bias source 31 is connected by a current-limiting resistor 33 to the line 35 from the multiplexer 26. The detector 38 is configured to sense the level of the component at the frequency $f_1$ in the signal from the multiplexer 26. The functions of the source 30, bias source 31 and filter 34 are preferably provided by suitable hardware circuitry, while the functions of the detector 38 are preferably performed by software control of a conventional digital signal processing unit.

The tester also connects the ground or voltage supply pins, 12g, 14g, 12s, 14s, etc., preferably both, to ground to provide return paths for the signals used in the tests.

In general, most IC pins connect to diodes in the IC. These diodes must be turned on, i.e. forward biased, to admit the input signals into the IC and to extract the outputs therefrom. The voltage provided by the source 30 to various input pins has sufficient amplitude to turn on the IC diodes connected to those pins. However, the output signals are generally of insufficient amplitude to provide conduction by the IC diodes connected to the output pins. The bias source 31 provides this function. That is, it forward biases the IC diodes connected to the IC output pins selected by me By way of multiplexer 26.

By way of example, the source 30 may provide input signals of 4 volts peak-to-peak, with the input current being limited by a source resistance of 50 ohms. The bias source 31 may provide a bias of 2.5 volts, with the resistor 33 having a value of 10k ohm. Assuming that the output signal to be used has the same frequency as the source 30, the filter 34 will preferably have a cutoff frequency somewhat above the source frequency. For example, with a source frequency of 7 kHz, the filter 34 may have a cutoff frequency of 10 kHz. This will prevent harmonics of the source frequency from reaching the detector 38.

First the system enters into a learn mode on a known good board of the type that is to be tested. Focusing on tests for the connection of the IC 12 to the circuit board traces to which the IC is nominally connected, the system checks all the pins of the IC for (a) the presence of internal IC diodes connected to those pins and (b) the polarities of the diodes. This is accomplished simply by applying a voltage of one polarity and then the opposite polarity to each pin and sensing the corresponding currents. When a pin is subsequently connected as an output pin, the polarity of the bias source 31 is set, in accordance with the detected polarity of the IC diode connected to that pin, to forward bias that diode. If a pin does not exhibit conduction during this procedure, its connection to a circuit board trace cannot be tested. If conduction appears to be exhibited, it may have been provided by a pin in another IC connected to the same trace. The untestability of that pin will be ascertained in the next phase of the learn mode.

Next the system methodically applies input signals to traces connected to pins on the IC 12 and senses the signals at the traces connected to other pins. In making these measurements the system preferably omits measurements in which both of the pins involved are connected by circuit board traces to the same other IC on the board. For example, there would be no test involving the pins 12a and 12c, since both of those pins are connected to circuit board traces that are also connected to pins of the IC 14.

After the foregoing measurements have been made, one could disconnect and reconnect the pins 12a. . . one at a time and repeat the measurements involving those pins. The second set of measurements would elicit difference-frequency responses from other IC's connected to the same circuit board traces. The system would then compare the respective measurements made with and without the IC 12 connected to the circuit board and sets thresholds for each set of IC 12 measurements between the output voltage levels obtained with the IC 12 pins connected and those with the respective pins disconnected from the circuit board.

To set the threshold in the foregoing manner would be unduly time consuming and also, in the case of chip-on-board connections, a number of boards would have to be destroyed to generate the signal patterns used to test the circuit boards. The preferred embodiment of the invention includes a test-pattern and threshold-setting procedure that does not require the interruption of any connections on the circuit board. Specifically for each IC, an initial set of measurements using the various possible pin combinations, is made as described above, but for each measurement a number of readings, e.g. 50, is taken for each pin-pair combination. The mean and standard deviation of these readings are calculated. The input pin of each pin pair is selected as the pin under test and another IC on the board is selected which has a pin connected to the selected pin on the subject IC. Readings are then taken with a pseudo pin pair consisting of (a) the remaining pin of the pair on the subject IC and (b) another pin on the second IC that is not connected to any pin on the subject IC. For example, assume that a pin pair on the IC 12 comprises input pin 12a and output pin 12e and that the selected pin for a test is the pin 12a. The pseudo-pin pair could then comprise the pins 12e of the IC 12 and the pin 14f, since the pin 12a is connected to the IC 14 and the pin 14f is not connected to the IC 12. Again, a number of readings are taken and the mean and standard deviation are calculated. A reliability factor is then calculated by dividing the difference of the two means by the sum of the two standard deviations.

This procedure is repeated for the various pin combinations on the subject IC and the pin combinations having the highest reliability factors are then selected for use in testing for open circuits of the subject IC.

The thresholds for the selected test measurements are then calculated. Basically, for each selected pin pair, the threshold is between (a) the mean of the measurements made with the selected pin pair and (b) the readings obtained from the corresponding pseudo-pin pair, the thresholds being weighted according to the standard deviations. Specifically the threshold is set by subtracting from the mean of the reading made with the selected pin-pair, the product of the reliability factor and the standard deviation of the readings made with the selected pin pair.

During a test of the circuit board, a pin is deemed to have passed the test if a reading made with the selected pin pair involving that pin exceeds the threshold. If it does not exceed the threshold the test is repeated a number of times, e.g. 50, and it is deemed to fail the test if the mean of those readings does not exceed the threshold.

If it is desired to ascertain which of the two pins in the pair has a bad connection circuit board trace, the system can test another pin pair involving one of the pins in the pair that failed the test.

I have found that the foregoing method of selecting the pin combinations and thresholds for the tests provides results that are close to those that would be obtained by making tests with the pins connected to and then disconnected from the respective circuit board traces. At the same time it is much quicker and less cumbersome than the alternative method.

Figure 2:
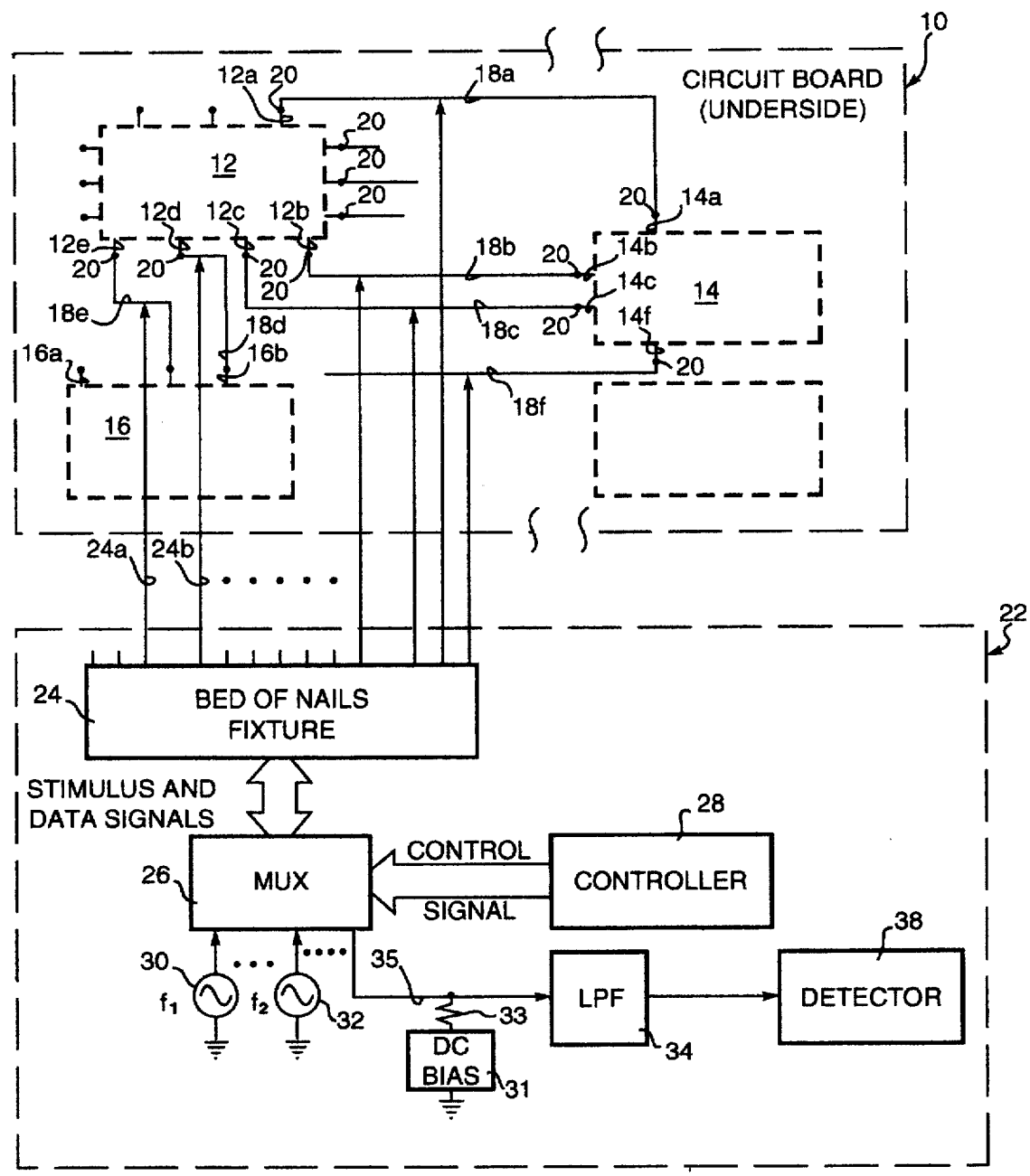
FIG. 2 is a schematic diagram of a second embodiment of the invention.

In FIG. 2 I have illustrated a second embodiment of the invention involving the use of two input frequencies. In that case the tester 22 includes a second input source 32 having a frequency $f_2$. Again the bias source 31 is arranged to bias the internal IC diode connected to the output pin into its conductive region.

By way of example, both the sources 30 and 32 may provide input signals of four volts peak-to-peak, with the input current being limited by a source resistance of 50 ohms. The source 31 may provide a bias of 2.5 volts, with the resistor 33 having a value of 10k ohm.

Assume, for example, that the pins 12a and 12b have been selected as input pins and that the pin 12e is an output pin, the controller 28 controls the multiplexer 26 to connect the sources 30 and 32 to the circuit board traces 18a and 18b and to connect the line 35 to the trace 18e. The a-c signals from the sources 30 and 32 propagate to the internal IC diode connected to the pin 12e, where the nonlinear characteristic of that diode provides a heterodyne action, resulting in the generation of the sum and difference frequencies, $f_1+f_2$ and $f_1-f_2$. Assuming that the difference frequency is used for the test, the detector 38 senses the signal amplitude at that frequency. If the amplitude exceeds a predetermined threshold, the connections of the pins 12a, 12b and 12e to the respective circuit board traces are assumed to be good. Otherwise, one of the connections is assumed to be faulty.

The learn mode for the tests made with the embodiment depicted in FIG. 2 is similar to the learn mode described above in connection with FIG. 1. The system methodically applies input signals to pairs of traces connected to pins on the IC 12 and senses the signals on a trace connected to another pin. In making these measurements, the system preferably omits measurements in which all three of the pins involved are connected by circuit boards traces to the same other IC on the board.

Again an initial set of measurements is taken, in this case each measurement involving a number of readings for each triad, i.e. three-pin combination, but for each measurement a number of readings, e.g. 50, is taken for each triad. The mean and standard deviation of these readings are calculated. One of the input pins of each pin triad is selected as the pin under test and another IC on the board is selected which has a pin connected to the selected pin on the subject IC. Readings are then taken with a pseudo-triad consisting of (a) the remaining two pins of the triad on the subject IC and (b) another pin on the second IC that is not connected to any pin on the subject IC. For example, assume that a triad on the IC 12 comprises input pins 12a and 12b and output pin 12e and that the selected pin for a test is the pin 12a. The pseudo-triad could then comprise the pins 12b and 12e of the IC 12 and the pin 14f. Again, a number of readings are taken and the mean and standard deviation are calculated. A reliability factor is then calculated by dividing the difference of the two means by the sum of the two standard deviations.

This procedure is repeated for the various pin combinations on the subject IC and the pin combinations having the highest reliability factors are then selected for use in testing for open circuits of the subject IC.

The thresholds are then calculated as set forth above and tests of the pin connections of the various IC's on a circuit board under test and then be made in accordance with those thresholds.

By way of example the frequencies $f_1$ and $f_2$ in the embodiment of f2 may be 40 kHz and 33 kHz (respectively) with the cutoff frequency of the filter 34 being preferably set to somewhat above the difference of those two frequencies. For example the filter may have a cutoff frequency of 10 kHz.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

For example, in the embodiment of FIG. 2, one of the input pins can also serve as an output pin, in which case the triad would be embodied in two physical pins. On the pin that serves as an output pin, the input voltage is substantially lower than the input voltages set forth above. For example, the value of 0.2 volt peak-to-peak has been found to function suitably. Also the bias voltage is lower, typically 0.5 volt. With this arrangement, the "local" source switches the diode at the output pin on and off, thereby providing efficient mixing of the two input signals. The learn mode would function as described above, with the pseudo-triad including a pin of another IC to which the other physical input pin of the subject triad is connected.

What is claimed is:

1. A method of detecting failures in connections between IC pins and circuit board traces to which they are nominally connected, said method comprising the steps of:

A. applying a first a-c input signal to a first circuit board trace to which a first pin of the IC is nominally connected;

B. detecting an a-c output signal, derived from said input signal, at a second circuit board trace to which a second pin of the IC is nominally connected, said output signal being present at said second pin, and C. comparing the level of said output signal with a predetermined threshold.

2. The method defined in claim 1 in which said output signal has the same frequency as said input signal.

3. The method defined in claim 1 including the step of applying to a third circuit board trace, to which a third pin is nominally connected, a second A-C input signal having a frequency different from that of said first input signal, said output signal having a frequency that is the sum or difference of the frequencies of the input signals.

4. The method defined in claim 1 including the step of applying to the second pin a bias current such as to forward bias an internal diode connected to that pin and disposed within the IC, thereby to facilitate propagation of the output signal to the second pin.

5. A method of detecting failures in connections between the pins of a first IC and traces on a circuit board, said pins being nominally connected to said traces, said circuit board further having one or more other ICs whose pins are connected to traces thereon, said method comprising the steps of:

(A) selecting a group of pins of said first IC such that no two pins of said group are nominally connected by circuit board traces to pins of any one of the other ICs, (B) applying a first a-c input signal to a first circuit board trace to which a first pin of said group is nominally connected, said first pin being an input pin, (C) detecting an a-c output signal, derived from said input signal, at a second circuit board trace to which a second pin of said group is nominally connected, said second pin being an output pin, and (D) comparing the level of said output signal with a predetermined threshold.

6. The method defined in claim 5 in which:

(A) the group consists of two pins, and (B) said output signal has the same frequency as said input signal.

7. The method defined in claim 5:
   (A) in which the group consists of the first and second pins and a third pin, and
   (B) including the step of applying a second a-c input signal of a second frequency to a third circuit board trace to which the third pin of said group is nominally connected, said third pin being an input pin, whereby said output signal has a frequency that is the sum or difference of said first and second frequencies.

8. The method defined in claim 5 further including a method for selection of pingroups, said selection method comprising:
   (A) selecting, as possible pin groups, pin groups of said first IC containing at least one pin that is not connected to another IC on the same circuit board,
   (B) for each possible pin group,
      1. performing an initial set of measurements for the pin group as. set forth in the applying, detecting, and comparing steps,
      2. calculating the mean and standard deviations of the output signals obtained from the set of measurements,
      3. selecting another IC on the circuit board which has a pin connected to an input pin of the pin group, taking a second set of readings with a pseudo pin group comprising said output pin on the first IC and another pin on the other IC, said other pin not being connected to any pin on the first IC,
   (C) calculating the mean and standard deviation of the second set of measurements,
   (D) deriving a reliability factor corresponding to the normalized difference of the means and standard deviations, and
   (E) selecting for tests of the various pin connections, the pin groups having the highest reliability factors.

9. The method defined in claim 8 including the further step of setting the threshold for each group to a value between the mean of the set of measurements for the group made in accordance with the performing, calculating, and selecting steps as set forth in paragraph (B) of claim 8 and the mean of the set of measurements made with the corresponding pseudo pin group, the means being weighted according to the standard deviations of the two sets of the two measurements.

10. The method defined in claim 5 including the step of applying to the output pin a bias current such as to forward bias an internal diode connected to that pin and disposed within the first IC, thereby to facilitate propagation of the output signal to the output pin.

11. A method of detecting failures in connections between IC pins and circuit board traces to which they are nominally connected, said method comprising the steps of:
   A. applying a first input signal of a first frequency to a first circuit board trace to which a first pin of the IC is nominally connected,
   B. applying a second input signal of a second frequency different from said first frequency to a circuit board trace to which a second pin of the IC is nominally connected, whereby said IC generates output signals at the sum and difference of said first and second frequencies at a third pin of the IC,
   C. detecting the level of one of said output signals at a circuit board trace nominally connected to said third pin of said IC.

* * * * *